(12) United States Patent
Bora et al.

(10) Patent No.: US 7,317,255 B2
(45) Date of Patent: Jan. 8, 2008

(54) RELIABLE PRINTED WIRING BOARD ASSEMBLY EMPLOYING PACKAGES WITH SOLDER JOINTS

(75) Inventors: Mumtaz Y. Bora, San Diego, CA (US); Charles E. Girardot, II, Jamul, CA (US)

(73) Assignee: Kyocera Wireless Corp., San Diego, CA (US)

( * ) Notice: Subject to any disclaimer, the term of this patent is extended or adjusted under 35 U.S.C. 154(b) by 197 days.

(21) Appl. No.: 10/956,405

(22) Filed: Sep. 30, 2004

(65) Prior Publication Data

US 2006/0065977 A1    Mar. 30, 2006

(51) Int. Cl.
*H01L 23/48* (2006.01)
*H01L 23/52* (2006.01)
*H01L 23/053* (2006.01)

(52) U.S. Cl. .............. 257/774; 257/701; 257/702; 257/E23.145

(58) Field of Classification Search .............. 257/701, 257/702, 774, E23.145; 174/262, 263
See application file for complete search history.

(56) References Cited

U.S. PATENT DOCUMENTS

| | | | |
|---|---|---|---|
| 6,222,277 B1 | 4/2001 | Downes | |
| 6,252,779 B1 | 6/2001 | Pierson et al. | |
| 6,353,189 B1 * | 3/2002 | Shimada et al. | 174/255 |
| 6,392,898 B1 * | 5/2002 | Asai et al. | 361/794 |
| 6,803,664 B2 * | 10/2004 | Murayama | 257/779 |
| 7,030,480 B2 * | 4/2006 | Kimura et al. | 257/698 |
| 2003/0183421 A1 | 10/2003 | Dishongh et al. | |
| 2004/0064942 A1 | 4/2004 | Chung et al. | |
| 2004/0118606 A1 | 6/2004 | McCormick et al. | |

\* cited by examiner

*Primary Examiner*—Nitin Parekh

(57) ABSTRACT

An exemplary assembly comprises a printed wiring board having a first surface, and a package including a plurality of solder joints, such as solder balls, on one surface of the package. An anchor via is defined through the first surface of the printed wiring board, and conductive material situated in the anchor via is connected to or integral with a respective solder joint of the package.

20 Claims, 3 Drawing Sheets

US 7,317,255 B2

RELIABLE PRINTED WIRING BOARD ASSEMBLY EMPLOYING PACKAGES WITH SOLDER JOINTS

FIELD OF THE INVENTION

The present invention relates to semiconductor package assembly. More specifically, the invention relates to printed wiring board assembly techniques involving packages having solder bumps and other solder joints.

BACKGROUND OF THE INVENTION

Packaging arrangements employing solder bumps are known. Examples include ball grid arrays ("BGAs") and chip-scale packages ("CSPs"). By way of illustration, BGAs have a series of solder bumps (or "balls") typically arranged on the bottom of the package. The solder balls are used to attach the BGA package to a printed wiring board ("PWB") using a reflow technique. During the reflow process, the solder balls are melted, and upon melting, the solder balls electrically and mechanically join various of the BGA package traces to various of the system PCB traces.

A PWB generally exhibits some degree of flexibility depending on its structural composition and its operating environment, whereas the packages mounted on the PWB remain relatively rigid by comparison. This difference can result in significant mechanical stresses being asserted between the PWB and the package, causing the physical connection between the package and the PWB to fail. An example of a severe failure is when the solder ball is disconnected from a corresponding contact on the PWB, resulting in an interruption of the connection between appropriate contacts of the package and the PWB. Such failures are typically remedied by way of expensive and time-consuming tear down and reassemble of the package and PWB, resulting in undesirable expense and inconvenience to both manufacturer and consumer.

Existing approaches for resolving this problem have a number of drawbacks. For example, the use of expensive rigid boards significantly raises costs. In addition, such rigid boards typically employ insulating layers comprising epoxy and glass, which, among other problems, are difficult to drill, e.g., for forming vias. Consequently, assembly productivity is reduced. Another approach is to increase the size of the solder balls used to connect packages and PWBs. However, increasing the volume of the solder balls between the surface of the package and the PWB can result in bridging adjacent solder balls, thereby undesirably shorting contacts, which can result in malfunctions and/or damage.

Accordingly, there remains a strong need in the art to provide a cost effective and reliable assembly for printed wiring board and packages employing solder joints.

SUMMARY OF THE INVENTION

An assembly for printed wiring boards and packages employing solder joints and related assembly technique are disclosed which address and resolve one or more of the disadvantages associated with conventional assembly arrangements, as discussed above.

By way of illustration, an exemplary assembly comprises a printed wiring board having a first surface, and a package including a plurality of solder joints, such as solder balls, on one surface of the package. An anchor via is defined through the first surface of the printed wiring board, and conductive material situated in the anchor via is connected to or integral with a respective solder joint of the package. In one embodiment, the solder joint connected to the conductive material in the anchor via is situated proximate a periphery or corner of the package. As discussed below, the particular arrangement of this assembly significantly improves reliability.

Other features and advantages of the present invention will become more readily apparent to those of ordinary skill in the art after reviewing the following detailed description and accompanying drawings.

DETAILED DESCRIPTION OF THE INVENTION

Figure 1:
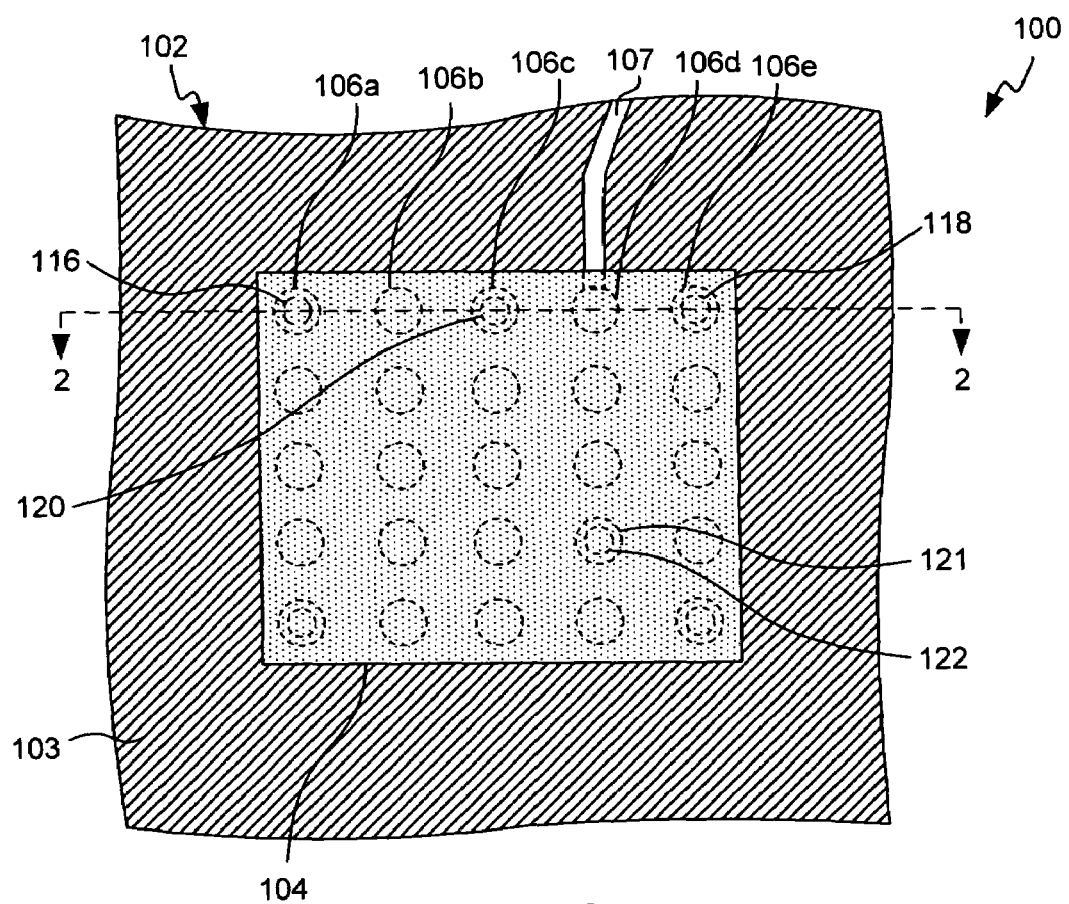
FIG. 1 illustrates an exemplary assembly employing a package with solder balls according to one embodiment of the present invention.

The drawings and their accompanying detailed description are directed to merely exemplary embodiments of the invention. To maintain brevity, other embodiments of the invention which use the principles of the present invention are not specifically described herein and are not specifically illustrated by the present drawings. It is noted that, for ease of illustration, the various elements shown in the drawings are not drawn to scale.

Referring first to FIG. 1, there is shown a top view of exemplary assembly 100 including PWB 102 and package 104 according to one embodiment of the invention. PWB 102 comprises a multi-layer wiring board. For example, PWB 102 may comprise a plurality of conductive layers, typically metal, each conductive layer being separated by a dielectric layer, typically epoxy. Package 104 is mounted on surface 103 of PWB 102. In certain embodiments, PWB 102 is capable of receiving a plurality of packages, e.g., two or more packages on the same surface or one package on a top surface and a second package on a bottom surface.

Package 104 may be any package having a plurality of solder joints, such as solder balls, for attaching to PWB 102. When mounted on PWB 102, the solder joints provide an electrical connection and a conductive path between elements of package 104 and elements attached to PWB 102, such as a supply voltage or a reference voltage, for example. In addition, the solder joints mechanically attach package 104 to PWB 102.

In an example embodiment where package 104 employs solder balls, package 104 is typically attached to PWB 102 using a reflow process, whereby the solder balls are melted, and upon melting, the solder balls are mechanically and electrically attached to corresponding bump attach sites on PWB 102. By way of illustration, bump attach sites 106a through 106e, and 121 are depicted and referenced in FIG. 1. Generally, bump attach sites comprise a metal layer formed and patterned on surface 103 of PWB 102. Certain bump attach sites are also connected to electrical traces formed on surface 103 for routing electrical signals to other elements (not shown). For example, bump attach site 106d is connected to electrical trace 107. Other bump attach sites, such as bump attach site 106c and 121 are electrically connected to intermediate metal layers of PWB 103 or other metal layers on a surface (such as an opposite surface to surface 103, for example) of PWB 102. For example, bump attach site 106c and 121 may be connected to an intermediate metal layer by way of interconnect vias 120 and 122, respectively.

Interconnect vias 120 and 122 are generally formed by drilling through bump attach site 106c and 121, respectively, and through a dielectric layer below bump attach sties 106c and 121 to the intermediate metal layer. Interconnect vias 120 and 122 are subsequently filled or plated with conductive material for providing an electrical connection between bump attach sites 106c and 121 and their respective intermediate metal layer. The respective intermediate metal layers are then electrically connected to respective elements, typically through other traces and other metal interconnects.

Continuing with FIG. 1, PWB 102 further includes one or more anchor vias, such as anchor vias 116 and 118. Anchor vias 116 and 118 are also filled (whether partially or completely) with conductive material. Typically, the conductive material filling anchor vias 116 and 118 comprises a portion of the solder ball attached to bump attach sites 106a and 106e, respectively. In other embodiments, anchor vias 116 and 118 are filled with conductive material prior to the process for attaching package to PWB 102. In assembly 100, the conductive material in anchor vias 116 ard 118 secure respective solder balls, and, thus, package 104 to PWB 102, as described below.

Anchor vias 116 and 118 are distinguished from interconnect vias 120 and 122, which function to provide an electrical connection between package 104 and a corresponding element attached to PWB 102. In contrast, anchor vias 116 and 118 and any conductive material therein are "isolated" conductors. That is, anchor vias and any conductive material therein do not directly provide an electrical connection or a conductive path to an element attached to PWB 102. Instead, as discussed above, anchor vias 116 and 118 and provide a cavity for conductive material situated therein to secure package 104 to PWB 102. Thus, electrical connections, if any, to package 104 by way of solder bumps attached to bump attach sites 106a and 106e corresponding to anchor vias 116 and 118, respectively, are provided by another electrical path, i.e., a path other than the conductive material in anchor vias 116 and 118. By way of illustration, a separate conductive path, such as a trace on surface 103, may be provided for providing the requisite electrical connection.

Figure 2:
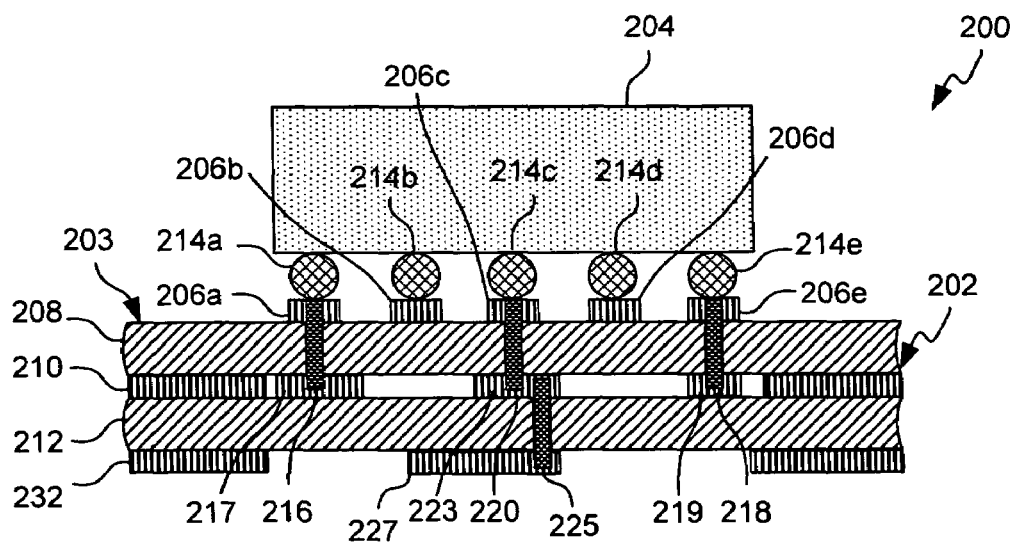
FIG. 2 illustrates a sectional view of the exemplary assembly of FIG. 1.

Referring to FIG. 2, assembly 200 shows a sectional view of assembly 100 of FIG. 1 taken at line 2—2. In FIG. 2, PWB 202, surface 203, package 204, bump attach sites 206a, 206b, 206c, 206d and 206e, anchor vias 216 and 218, and interconnect via 220 correspond to PWB 102, surface 103, package 104, bump attach sites 106a, 106b, 106c, 106d and 106e, anchor vias 116 and 118, and interconnect via 120, respectively, in FIG. 1.

In the example embodiment shown in FIG. 2, PWB 202 comprises a multi-layer wiring board including metal layers separated by dielectric layers. Typically, bump attach sites 206a, 206b, 206c, 206d and 206e are formed from a first metal layer situated on surface 203 of PWB 202. As shown in FIG. 2, dielectric layer 208 is situated below surface 203, intermediate metal layer 210 is situated below dielectric layer 208, dielectric layer 212 is situated below intermediate metal layer 210, and intermediate metal layer 232 is situated below dielectric layer 212. Additional layers (not shown for simplicity) may be situated below intermediate metal layer 232. Package 204 is attached to PWB 202 by way solder balls attached to corresponding bump attach sites. For example, solder balls 214a, 214b, 214c, 214d and 214e are connected to bump attach sites 206a, 206b, 206c, 206d and 206e, respectively.

Continuing with FIG. 2, PWB 202 further comprises anchor vias 216 and 218 and interconnect via 220. Anchor vias 216 and 218 are filled (whether partially or completely) with conductive material, such as with a metal. In one embodiment, the conductive material in anchor vias 216 and 218 comprise a portion of solder balls 214a and 214e, respectively, as a result of the reflow process used to mount package 204 to PWB 202. In the particular embodiment shown in FIG. 2, anchor vias 216 and 218 extend from bump attach sites 206a and 206e, respectively, through dielectric layer 208 and to intermediate metal layer segments 217 and 219, respectively. As shown in FIG. 2, the conductive material in anchor vias 216 and 218 extend through dielectric layer 208 to intermediate metal layer segments 217 and 219, respectively. It is noted that anchor vias 216 and 218 and the conducive material therein and intermediate metal layer segments 217 and 219 comprise isolated conductors. Specifically, intermediate metal layer segments 217 and 219 are isolated metal layer segments. Thus, intermediate metal layer segments 217 and 219 are directly electrically connected only to the conductive material in anchor vias 216 and 218, respectively. As such, anchor vias 216 and 218 and the conducive material therein and intermediate metal layer segments 217 and 219 do not directly provide electrical connectivity to other components attached to PWB 202. Instead, anchor vias 216 and 218 and the conducive material therein and intermediate metal layer segments 217 and 219 are arranged to mechanically secure package 204 to PWB 202. Thus, any electrical connections required to be made to package 204 by way of solder bumps 214a and 214e are made by way through a separate conductive path, e.g., by way of separate electrical traces connected to bump attach sites 206a and 206e.

By way of contrast, interconnect via 220 provides a direct electrical path to a component (not shown) attached to PWB 202. With reference to FIG. 2, interconnect via 220 electrically connects solder ball 214c and bump attach site 206c to metal segment 227 by way of conductive material in interconnect via 220, metal segment 223 and conductive material in interconnect via 225. Metal segment 227 then provides an electrical path to a corresponding component by way other conductive traces or interconnects. In contrast, anchor vias 216 and 218 and intermediate metal segments 217 and 219, respectively, are isolated. As pointed out above, any electrical connections required to be made to package 204 by way of solder bumps 214a and 214e are made by way through a separate conductive path.

The particular arrangements depicted in FIGS. 1 and 2 result in significantly improving the reliability of assemblies 100 and 200. The reason is that anchor vias 216 and 218 and the conductive material therein, which are attached to or integral with solder balls 214a and 214e, more securely attach package 204 to PWB 202. Instead of a relatively small point of contact on the surface of bump attach sites 206a and 206e, interior walls defining anchor vias 216 and 218 and metal segments 217 and 219 along with the surface area of bump attach sites 206a and 206e provide significantly greater mounting surface for securing solder balls 214a and 216e to PWB 202. Thus, despite the flexibility of PWB 202, the likelihood for solder balls 214a and 214e to be dislodged from PWB 202 is greatly reduced. It has been found that arranging one or more anchor vias to the periphery of the package significantly improves assembly reliability. For example, employing anchor vias corresponding to solder balls proximate to the corner or periphery of package 204 and 104 enhances connectivity and reliability of assemblies 200 and 100, respectively.

FIGS. 3A through 3D show cross-sectional views of some of the features of an assembly incorporating anchor vias in intermediate stages of assembly, formed in accordance with an exemplary embodiment of the invention. The steps for forming interconnect vias are not described for simplicity.

Figure 3A:
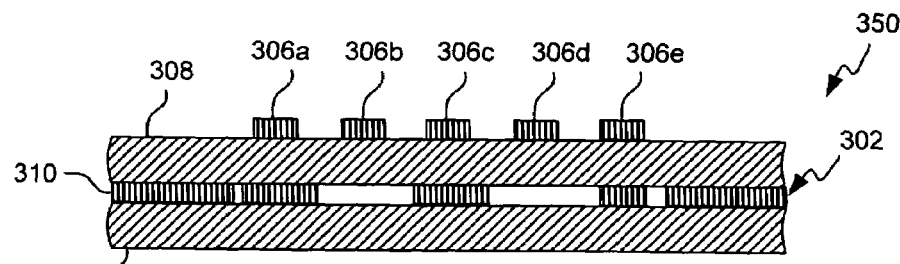
FIGS. 3A through 3D illustrate exemplary assembly arrangements according to various stages of assembly according to one embodiment of the present invention.

Referring to FIG. 3A, intermediate assembly 350 comprises PWB 302. Bump attach sites 306a, 306b, 306c, 306d and 306e are formed from a first metal layer situated on one surface of PWB 302. Dielectric layer 308 is situated below bump attach sites 306a, 306b, 306c, 306d and 306e. Intermediate metal layer 310 is situated below dielectric layer 308, and dielectric layer 312 is situated below intermediate metal layer 310. Additional layers (not shown for simplicity) may be situated below dielectric layer 312.

Figure 3B:
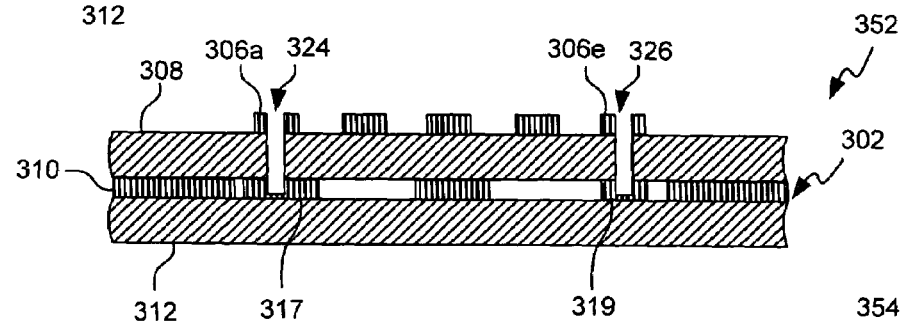

Referring to FIG. 3B, intermediate assembly 352 is shown according to another stage of assembly. In assembly 352, anchor vias 324 and 326 have been formed through bump attach sites 306a, 306b, 306c, 306d and 306e, dielectric layer 308, and a portion of intermediate metal segments 317 and 319. For example, anchor vias 324 and 326 can be formed by drilling through bump attach sites 306a, 306b, 306c, 306d and 306e, dielectric layer 308, and a portion of intermediate metal segments 317 and 319.

Figure 3C:
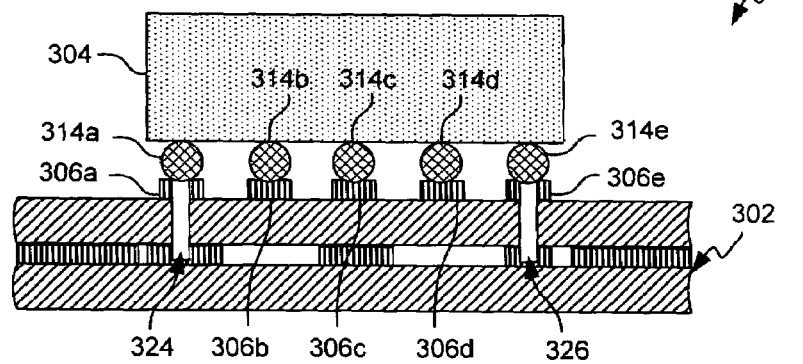

Referring to FIG. 3C, intermediate assembly 354 is shown according to another stage of assembly. In assembly 354, package 304 including a plurality of solder balls has been arranged over PWB 302. Specifically, solder balls 314a, 314b, 314c, 314d and 314e are interfaced with bump attach sites 306a, 306b, 306c, 306d and 306e, respectively.

Figure 3D:
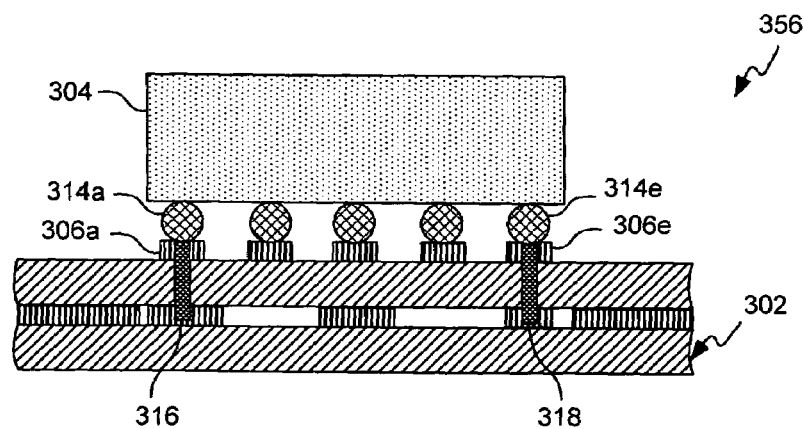

Referring to FIG. 3D, intermediate assembly 356 is shown according to another stage of assembly after a reflow process. During the reflow process, the solder balls of package 304 are melted, and upon melting, mechanically and electrically connect package 304 to PWB 302. In addition, a portion of solder balls 314a and 314e fill (partially or completely) vias 316 and 318, respectively. As discussed above, this particular arrangement more securely anchors package 304 to PWB 302, thereby forming a significantly more reliable assembly. Moreover, very little expense is added to the assembly process, since the technique for forming anchor vias is similar to that used to form interconnect vias, and the technique used for filling anchor vias is similar to that used to fill interconnect vias.

Figure 4:
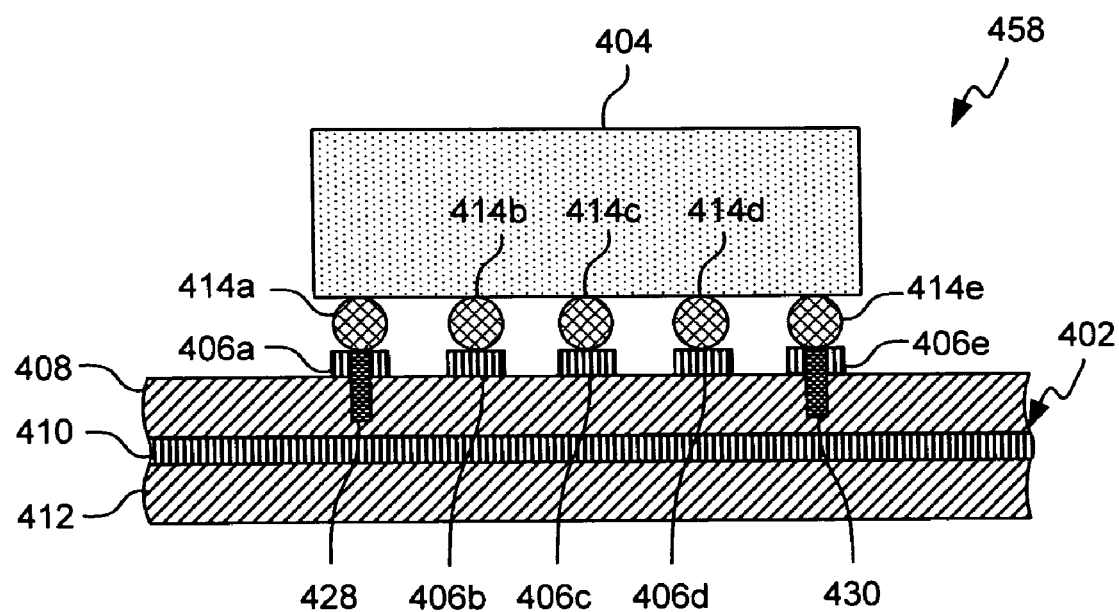
FIG. 4 illustrates an exemplary assembly employing a package with solder balls according to another embodiment of the present invention.

As discussed above, an anchor via is distinct from a traditional interconnect via in that the conductor in an anchor via is an isolated conductor. To further illustrate this concept, reference to FIG. 4 is now made. FIG. 4 illustrates assembly 458 according to another embodiment of the invention. In FIG. 4, PWB 402, package 404, bump attach sites 406a, 406b, 406c, 406d and 406e, dielectric layer 408, intermediate metal layer 410, dielectric layer 412, and solder balls 414a, 414b, 414c, 414d and 414e correspond to PWB 202, package 204, bump attach sites 206a, 206b, 206c, 206d and 206e, dielectric layer 208, intermediate metal layer 210, dielectric layer 212, and solder balls 214a, 214b, 214c, 214d and 214e in FIG. 2.

However, in contrast to assembly 200 of FIG. 2, anchor vias 428 and 430 of assembly 458 do not extend to intermediate metal layer 410. The conductive material in anchor vias 428 and 430 more clearly illustrates that the conductive material is "isolated" and does not provide a direct electrical connection or conductive path to another component (such as a supply voltage or a reference voltage, for example) attached to PWB 402. Any electrical connection required to be made to package 404 by way of solder bumps 414a and 414e and bump attach sites 406a and 406e are by way of a separate electrical connection. Referring back to FIG. 2, even though the conductive material in anchor vias 216 and 218 are connected to intermediate metal segments 217 and 219, the conductive material in anchor vias 216 and 218 along with intermediate metal segments 217 and 219 are also "isolated" conductors, similar to assembly 458 in FIG. 4. The reason is that conductive material in anchor vias 216 and 218 and intermediate metal segments 217 and 219 do not provide a direct conducive path to a component in the manner that interconnect vias do, as discussed above.

While the description set forth above has been illustrated with packages employing solder bumps, such as BGAs and CSPs, it is noted that the present invention also could be applied to benefit other types of assemblies with packages employing other types of solder joint configurations. For example, certain non-solder ball packages employ "flat" joints. When such packages are connected to an anchor via in a printed wiring board, and solder flows in the anchor via during assembly, a similar improvement in the assembly reliability can be achieved.

From the above description of exemplary embodiments of the invention, it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the specific layout arrangement on a printed wiring board could be modified from that discussed above without departing from the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

What is claimed is:

1. An assembly, comprising:
   a package;
   a printed wiring board including electrical components and electrical interconnects, each of the electrical components being electrically connected to one of the electrical interconnects;
   solder joints connecting the package to the printed wiring board such that each solder joint contacts the package;
   vias extending into the printed wiring board;
   electrical conductors positioned in each of the vias, each electrical conductor being positioned in a different one of the vias and contacting one of the solder joints such that each electrical conductor contacts a different one of the solder joints,
   a portion of the vias being interconnect vias configured to provide electrical communication between the package and the electrical components on the printed wiring board during operation of the assembly, and
   a portion of the vias being anchor vias that are each electrically isolated from the electrical components on the printed wiring board.

2. The assembly of claim 1, wherein the printed wiring board includes a dielectric layer and each anchor via extends no more than part way into the dielectric layer.

3. The assembly of claim 2, wherein the printed wiring board includes a dielectric layer and each anchor via extends through the dielectric layer.

4. The assembly of claim 1, wherein each electrical conductor includes solder that is integral with one of the solder joints.

5. The assembly of claim 4, wherein the printed wiring board includes bump attach sites defined in a layer positioned between a dielectric layer and the package, the bump attach sites each being bonded directly to the solder.

6. The assembly of claim 4, wherein the printed wiring board includes bump attach sites defined in a metal layer positioned between a dielectric layer and the package, the bump attach sites each being bonded directly to the solder.

7. The assembly of claim 6, wherein each of the electrical conductors extends through a bump attach site and at least part way into the dielectric layer.

8. The assembly of claim 1, wherein the solder joints extend into each of the anchor vias.

9. The assembly of claim 1, wherein each solder joint is a solder ball.

10. The assembly of claim 1, wherein the printed wiring board includes a metal layer between dielectric layers and the electrical conductor in each of the anchor vias extends through one of the dielectric layers into contact with an electrically isolated segment of the metal layer.

11. The assembly of claim 10, wherein the electrical conductor in one of the interconnect vias extends through one of the dielectric layers into contact with a portion of the metal layer that is configured to serve as an interconnect between the interconnect via and a component on the printed wiring board.

12. The assembly of claim 1, wherein the printed wiring board includes a metal layer between dielectric layers and the electrical conductor in one of the interconnect vias extends through one of the dielectric layers into contact with a portion of the metal layer that is configured to serve as an interconnect between the interconnect via and a component on the printed wiring board.

13. The assembly of claim 1, wherein:
the printed wiring board includes a first metal layer between a first dielectric layers and a second dielectric layer, the first dielectric layer being positioned between the second dielectric layer and the package;
the printed wiring board includes bump attach sites defined in a second metal layer positioned between the first dielectric layer and the package, the bump attach sites each being bonded directly to the solder;
the electrical conductors each extend though one of the bump sites and at least part way into the first dielectric layer.

14. The assembly of claim 13, wherein the electrical conductors each extend though one of the bump sites and only part way into the first dielectric layer.

15. The assembly of claim 13, wherein the electrical conductors each extend though one of the bump sites and through the first dielectric layer.

16. The assembly of claim 15, wherein the electrical conductors each extend though the first dielectric layer into contact with the first metal layer.

17. The assembly of claim 16, wherein
the first metal layer includes isolation regions that are electrically isolated from the components, and
the electrical conductor in each of the anchor vias extends though the first dielectric layer and is in electrical communication with one of the isolation regions.

18. The assembly of claim 16, wherein
the first metal layer includes interconnection regions that are in electrical communication with a component, and
the electrical conductor in each of the interconnect vias extends though the first dielectric layer and is in electrical communication with one of the interconnect regions.

19. The assembly of claim 16, wherein
the first metal layer includes isolation regions that are electrically isolated from the components,
the first metal layer includes interconnection regions that are in electrical communication with a component, and
the electrical conductor in each of the anchor vias extends though the first dielectric layer and is in electrical communication with one of the isolation regions.
the electrical conductor in each of the interconnect vias extends though the first dielectric layer is in electrical communication with one of the interconnect regions.

20. The assembly of claim 1, wherein each solder joint directly contacts only one of the conductors.

* * * * *